ial safety data sheet (2013), retrieved from datasheets.scbt.com

United States Patent
Wright, Jr. et al.

(10) Patent No.: US 12,312,678 B2
(45) Date of Patent: May 27, 2025

(54) METHODS FOR DEPOSITING A TUNGSTEN OR MOLYBDENUM LAYER IN THE PRESENCE OF A REDUCING CO-REACTANT

(71) Applicant: ENTEGRIS, INC., Billerica, MA (US)

(72) Inventors: Robert Wright, Jr., Newtown, CT (US); Bryan C. Hendrix, Danbury, CT (US); Thomas H. Baum, New Fairfield, CT (US); James Woeckener, Wappingers Falls, NY (US)

(73) Assignee: ENTEGRIS, INC., Billerica, MA (US)

( * ) Notice: Subject to any disclaimer, the term of this patent is extended or adjusted under 35 U.S.C. 154(b) by 172 days.

(21) Appl. No.: 16/713,506

(22) Filed: Dec. 13, 2019

(65) Prior Publication Data

US 2020/0199743 A1    Jun. 25, 2020

Related U.S. Application Data

(60) Provisional application No. 62/781,881, filed on Dec. 19, 2018.

(51) Int. Cl.
| | | |
|---|---|---|
| *C23C 16/14* | (2006.01) | |
| *C23C 16/06* | (2006.01) | |
| *C23C 16/455* | (2006.01) | |
| *C23C 16/50* | (2006.01) | |

(52) U.S. Cl.
CPC .............. *C23C 16/14* (2013.01); *C23C 16/06* (2013.01); *C23C 16/45536* (2013.01); *C23C 16/45553* (2013.01); *C23C 16/50* (2013.01)

(58) Field of Classification Search
None
See application file for complete search history.

(56) References Cited

U.S. PATENT DOCUMENTS

| | | | |
|---|---|---|---|
| 6,211,082 B1* | 4/2001 | Yoo ......................... | C23C 16/08 |
| | | | 257/E21.168 |
| 6,383,566 B1 | 5/2002 | Zagdoun | |
| 6,972,267 B2 | 12/2005 | Cao | |
| 2002/0146903 A1 | 10/2002 | Locke | |
| 2003/0082296 A1* | 5/2003 | Elers ................. | C23C 16/45531 |
| | | | 257/E21.582 |
| 2003/0198587 A1 | 10/2003 | Kaloyeros | |
| 2004/0180557 A1* | 9/2004 | Park ................. | H01L 21/02216 |
| | | | 257/E21.279 |
| 2007/0123060 A1* | 5/2007 | Rahtu ................. | H01L 21/3141 |
| | | | 438/783 |
| 2008/0081127 A1 | 4/2008 | Thompson et al. | |
| 2009/0156003 A1 | 6/2009 | Xi | |
| 2015/0279735 A1* | 10/2015 | Hotta ................. | H01L 21/28556 |
| | | | 438/656 |
| 2016/0115588 A1* | 4/2016 | Gatineau ........... | C23C 16/45536 |
| | | | 438/681 |
| 2016/0348234 A1* | 12/2016 | Suzuki .............. | H01L 21/28562 |
| 2017/0062224 A1 | 3/2017 | Fu et al. | |
| 2019/0067003 A1* | 2/2019 | Zope .................. | H01L 21/0228 |
| 2019/0341302 A1* | 11/2019 | Lei ..................... | H01L 21/02205 |
| 2019/0368039 A1* | 12/2019 | Arteaga ................. | C07F 11/00 |
| 2020/0199743 A1 | 6/2020 | Wright, Jr. et al. | |
| 2021/0140043 A1* | 5/2021 | Thombare ............... | C23C 16/06 |

FOREIGN PATENT DOCUMENTS

| | | |
|---|---|---|
| CN | 105097446 A | 11/2015 |
| CN | 109661481 A | 4/2019 |
| JP | 2016098406 A | 5/2016 |
| KR | 20090082543 A | 7/2009 |
| KR | 20150048085 A | 5/2015 |
| TW | 200914630 A | 4/2009 |
| TW | 201331404 A | 8/2013 |
| TW | 201545210 A | 12/2015 |
| TW | 201603189 A | 1/2016 |
| TW | 201701336 A | 1/2017 |
| TW | 201715084 A | 5/2017 |
| TW | 201810379 A | 3/2018 |

OTHER PUBLICATIONS

Chemical Book. "13814-75-0(Molybdenum (VI) Tetrachloride Oxide) Product Description" (2017). Retrieved from www.chemicalbook.com/ChemicalProductProperty_US_CB0313425.aspx (Year: 2017).*
Santa Cruz Biotechnology. Molybdenum dichloride dioxide material safety data sheet (2013), retrieved from datasheets.scbt.com (Year: 2013).*
Toronto Research Chemicals Inc. Safety Data Sheet for molybdenum (V) chloride (2014), retrieved from www.trc-canada.com/ (Year: 2014).*
Chengsong, Thin Film Technology and Application, Northeastern University Press, pp. 120-121, 1998.
Dai Dahuang et al., Functional Thin Films and Deposition Technology, Metallurgical Industry Press, pp. 323, 2013.

(Continued)

*Primary Examiner* — Jose I Hernandez-Kenney

(57) ABSTRACT

Described are vapor deposition methods for depositing metal films or layers onto a substrate, e.g., wherein the metal is molybdenum or tungsten; the methods involve vapor deposition of a metal layer onto a substrate from a metal-containing precursor in the presence of reducing gas (e.g., hydrogen) and a nitrogen-containing reducing compound.

16 Claims, 1 Drawing Sheet

(56) References Cited

OTHER PUBLICATIONS

Office Action issued in Chinese counterpart application No. 201980083584.4 on May 18, 2023, and machine translation of same, submitted as concise explanation of relevance of NPL 1, Chengsong, Thin Film Technology and Application, Northeastern University Press, pp. 120-121, 1998 ("Chengsong"), which indicates Chengsong is a background technology document, i.e., document reflecting some technical features of the claims or relevant prior art (18 pages).

Office Action issued in Chinese counterpart application No. 201980083584.4 on Sep. 14, 2024, and machine translation of same, submitted as concise explanation of relevance of NPL 2, Dai Dahuang et al., Functional Thin Films and Deposition Technology, Metallurgical Industry Press, pp. 323, 2013 ("Dai Dahuang"), which indicates Dai Dahuang is "common-sense evidence" (14 pages).

* cited by examiner

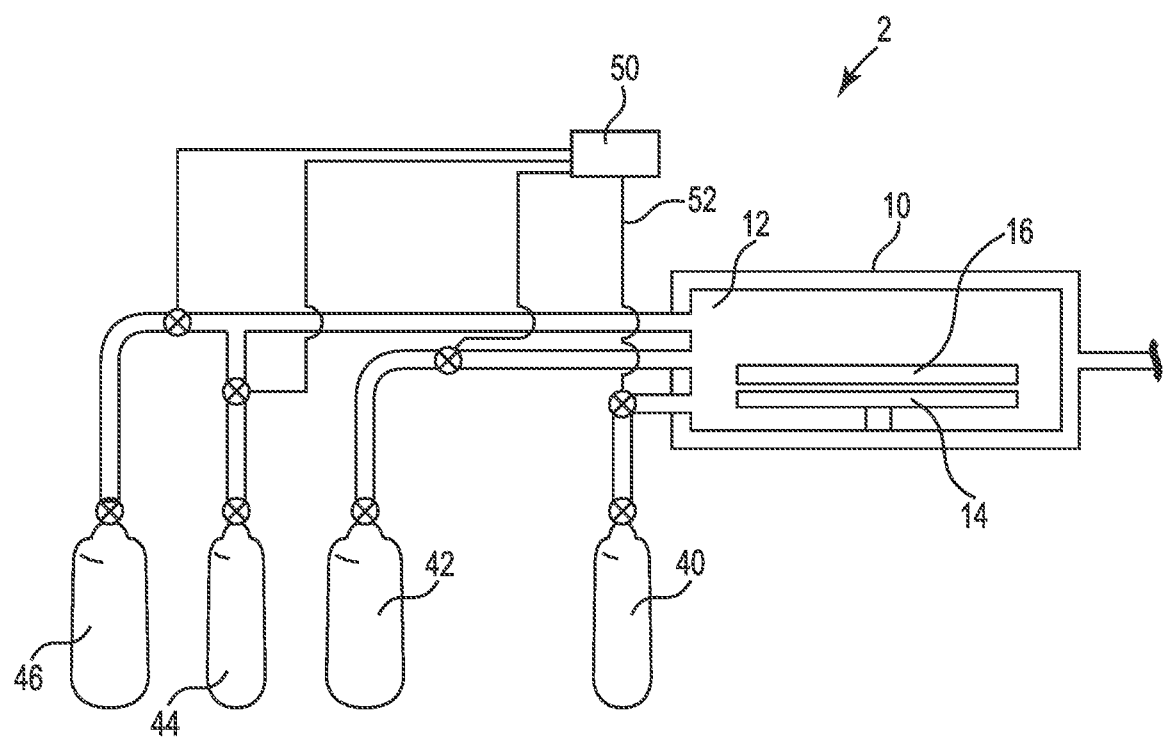

METHODS FOR DEPOSITING A TUNGSTEN OR MOLYBDENUM LAYER IN THE PRESENCE OF A REDUCING CO-REACTANT

FIELD

The present disclosure relates to vapor deposition methods for depositing metal films or layers onto a substrate, e.g., wherein the metal is molybdenum or tungsten. The methods involve vapor deposition of a metal layer onto a substrate from a metal-containing precursor in the presence of reducing gas (e.g., hydrogen) and a nitrogen-containing reducing compound.

BACKGROUND

Metals that include molybdenum and tungsten, in purified forms, are low-resistivity refractory metals that are used in microelectronic devices such as memory, logic chips, and other devices that contain polysilicon-metal gate electrode structures. Various vapor deposition techniques, with a range of raw material inputs, have been used to deposit thin metal layers of molybdenum or tungsten for these applications. By vapor deposition techniques a "precursor" compound that contains the metal is processed inside of a deposition chamber that contains a substrate, with process materials and conditions (e.g., elevated temperature) being effective to cause metal from the precursor to be deposited as a metal thin-film layer on the substrate.

Vapor deposition techniques include methods referred to as physical vapor deposition (PVD), chemical vapor deposition (CVD), and atomic layer deposition (ALD) techniques, which also include a number of derivative versions of these such as UV laser photo-dissociation CVD, plasma assisted CVD, and plasma assisted ALD, among others. For depositing metals of high purity on two or three-dimensional microelectronic device substrates, these types of vapor deposition methods can be desirable because they can give high levels of purity of a deposited metal, often with good conformal step coverage on highly non-planar microelectronic device geometries.

In a typical vapor deposition method a vaporized (gaseous) precursor is contacted with a substrate (e.g., a wafer), which may be optionally heated, in a low pressure or ambient pressure deposition chamber. At the conditions of the deposition chamber, the precursor generates metal atoms that when introduced to the substrate become deposited onto the substrate surface to form a thin layer (or "film") of highly pure deposited metal. Volatile by-products are removed by gas flow through the deposition chamber.

Along with gaseous precursor, a vapor deposition process typically involves supplying one or more additional gases (sometimes referred to as "reactant gases" or "co-reactants") to the reaction chamber, during deposition. In various ways, the reactant gas may function to allow the deposition process to perform more efficiently or with improved deposition results. Some reactant gases react with a portion of the precursor to facilitate release the metal of the precursor and formation of stable gaseous by-products. Other reactant gases can perform various different functions, such as to improve the performance or useful lifetime of a deposited film or to lower the film's resistivity.

For precursors, tungsten and molybdenum films have been formed by vapor deposition methods with the use of some well-known halide-containing precursors that include fluorine-containing precursors such as tungsten fluorides (e.g., tungsten hexafluoride, tungsten pentafluoride) and chlorine-containing precursors. While fluorine-containing precursors have been widely used for 30 years, fluorine based precursors may be presently disfavored due to the presence of fluorine, the need for special handling precautions, and the deleterious effects of fluorine on the long-term performance of the integrated circuit.

Non-fluorinated precursor alternatives have been developed, such as chlorine, bromine or iodine-containing precursors: molybdenum pentachloride, molybdenum pentabromide and molybdenum oxyhalides, such as $MoO_2Cl_2$, $MoO_2Br_2$, and $MoOCl_4$, tungsten pentachloride, tungsten hexachloride. Difficulty with using these halogen-containing precursors is that vapor deposition methods using these precursors typically involve heating a substrate to a temperature of at least about 400° C. or 450° C., and up to 800° C. These high temperatures make the processing equipment complex and consume thermal budget for temperature-sensitive devices, meaning that temperature-sensitive substrates such as logic devices can be damaged. Precursors that can allow for a metal layer to be deposited at lower temperatures would be preferred by allowing for lower operating temperatures, the use of less expensive, less complex equipment, and would be especially beneficial for fabricating temperature-sensitive devices, such as logic devices.

Still other types of precursors include: carbonyl-containing precursors such as molybdenum hexacarbonyl ($Mo(CO)_6$) and tungsten hexacarbonyl ($W(CO)_6$), imide-amide precursors, and organometallic precursors such as those that contain an organic ligand, such as cyclopentadienyl, alkylcyclopentadineyl, aryl and alkyaryl ligands and hydrides (among many others) attached to the metal atom. Useful examples of these types of precursors can be deposited at temperatures that are lower than those required for halide and oxyhalde precursors. But the deposited metal structures can suffer from high resistivity because carbon and oxygen from the precursor can become incorporated into the deposited metal as contaminants. Also step coverage may lack sufficient quality, but might improve with the lower deposition temperatures.

Various different types of challenges are presented during vapor deposition processes, due to the need for precision deposition of the metal layer onto a nano-scale structure that has two- or three-dimensional features made of materials that may be temperature sensitive or not highly chemically resistant. The substrate may include shapes that includes high aspect ratio holes, vias, trenches or channels that need to be filled using the deposited metal, or may be made of sensitive materials such as titanium nitride, which can be prone to chemical degradation (e.g., "etching" or "contamination"). Also required are good coating properties, including uniformity, step coverage, and conformality on a three-dimensional substrate. Other challenges are presented by the type of precursors that is used. Precursors that contain carbon or oxygen, such as metal carbonyls and organometallic precursors, can result in oxygen and carbon contaminants derived from the precursor and remaining in a deposited metal layer, which detrimentally affects performance properties (i.e., resistivity) of the deposited metal layer.

Based on these considerations, among others, there is a need to improve methods for depositing molybdenum and tungsten metal films and metal layers on a variety of substrates such as memory and logic devices, and including the precursors used for film growth. Improved processes may be ones that are performed at a lower deposition temperature, that can be deposited without causing physical damage to the substrate in the form of erosion, etching, etc., or both, preferable also while achieving very high purity of the deposited metal layer.

SUMMARY

In the microelectronic industry, molybdenum and tungsten layers are used in a variety of logic and memory devices. These metal layers are formed by vapor deposition from tungsten- and molybdenum-containing precursors that may be fluorinated, chlorinated, organometallic, etc. Depending on the substrate and the precursor, different vapor deposition processes come with different technical challenges. In a general sense, a reduced temperature of a vapor deposition method is desired if the method can be still be performed efficiently and effectively. Some types of precursors (e.g., halogenated precursors) typically require higher temperatures compared to others (e.g., metal carbonyls). Some types of precursors, such as the metal-carbonyls, can produce a metal that has an undesirable level of contamination in the form of oxygen or carbon. Considering different types of substrates, some are prone to damage from chemical effects during a deposition step (e.g., titanium nitride can suffer from etching), others require very particular placement and uniformity of a deposited metal layer (e.g. three dimensional NAND or other memory devices that require good uniformity and step coverage), while still others (logic device substrates) are temperature sensitive and cannot be exposed to temperatures that may be required for vapor deposition methods that use certain types of precursors (e.g., halogenated precursors).

According to Applicant's invention, vapor deposition methods can be performed by introducing a combination of gaseous fluids into a deposition chamber that contains a substrate. The gaseous fluids include a gaseous metal-containing precursor, a co-reactant that is a reducing gas, optional inert gas, and a nitrogen-containing reducing gas that is also a base. The invention results in particularly useful or effective vapor deposition of the metal from the precursor onto the substrate.

As one potential benefit, a temperature required to perform the vapor deposition step may be relatively lower than a temperature that is required in a similar process that does not use the nitrogen-containing reducing compound. One or more other benefits may potentially also result, depending on the type of precursor and the type of substrate. Examples of other potential benefits may include one or more of: an improved feature or quality of a deposited metal layer such as by reducing the presence of contaminants (e.g., oxygen or carbon) in the metal layer, especially in a vapor deposition method that can result in this type of contaminant being present in the deposited metal layer; improving the form of the metal layer as a coating such as in terms of uniformity with certain substrates (e.g., substrates having-dimensional shape features); reducing negative chemical effects of the vapor deposition process on the substrate such as etching or erosion.

A vapor deposition method may be performed in any suitable manner as variously described herein, by an atomic layer deposition method, by a chemical vapor deposition method, a physical vapor deposition method, or by a modified version or derivative version of one of these. The method is performed using process parameters and conditions that include a flow of the precursor, a reducing gas (e.g., hydrogen), and a nitrogen-containing reducing gas.

Examples of nitrogen-containing reducing compounds that have been found to be useful include those characterized by the general formula:

$$H-NR_1R_2$$

wherein the $R_1$ and $R_2$ can be selected to include one of the following combinations:
  each of $R_1$ and $R_2$ is hydrogen (i.e., the compound is $NH_3$),
  $R_1$ is hydrogen and $R_2$ is a lower alkyl (e.g., methyl, ethyl, propyl, butyl, etc.),
  $R_1$ is $=NH_2$ and $R_2$ is hydrogen,
  $R_1$ is a lower alkyl and $R_2$ is a lower alkyl, or
  $R_1$ and $R_2$ connect to form a nitrogen-containing cyclic compound.

These non-limiting and exemplary compounds include $NH_3$; hydrazine ($H_2N=NH_2$); alkylhydrazines, and alkyl amine and di-alkyl amine compounds such as methyl amine, ethyl amine, butylamine, dimethylamine, diethylamine, etc., and pyridine.

A precursor used in the vapor deposition method as described can be any of various precursors known to be effective for depositing a metal layer of tungsten or molybdenum. The precursor is a compound that contains the metal, which is either tungsten or molybdenum, and one or more associated chemical residues such as fluorine (with optional oxygen) or chlorine (with optional oxygen).

The molybdenum or tungsten layer can be deposited onto any desired substrate and any specific material of a substrate, with example substrates being microelectronic device substrates that are "in-process," meaning in the process of being fabricated yet incomplete. The microelectronic device may be one that provides memory function or one that provides logic function. The deposited molybdenum may have a thickness that is effective to perform a desired function, and can be continuous.

BRIEF DESCRIPTION OF THE FIGURE

FIG. 1 is a schematic illustration of a system for performing a vapor deposition step, as described.

DETAILED DESCRIPTION

The following description relates to vapor deposition methods useful for depositing a highly pure layer of molybdenum or tungsten metal onto a substrate. The vapor deposition methods include flowing gaseous metal-containing precursor to an interior of a deposition chamber that contains the substrate for deposition, with a first co-reactant that is a reducing compound (e.g. hydrogen), and with a second co-reactant that is a reducing compound that contains nitrogen. The conditions of the deposition chamber (e.g., elevated temperature), and the flow and pressure of the precursor, first co-reactant, and second co-reactant combine to cause tungsten or molybdenum metal from the precursor to become deposited onto a surface of the substrate as a substantially pure deposited metal film.

The vapor deposition method can be any type of vapor deposition method, including those methods commonly referred to as atomic layer deposition, those methods commonly referred to as chemical vapor deposition, those commonly referred to as plasma-enhanced vapor deposition, and modifications of these.

Chemical vapor deposition (CVD) and atomic layer deposition (ALD) are chemical processes by which a chemical material (referred to as a precursor), optionally and typically in combination with one or more other materials such as a co-reactant, is introduced to a substrate within a deposition chamber with the result of forming a thin "layer" or "film" of a material derived from the precursor onto a surface of the substrate. In a chemical vapor deposition process or a physical vapor deposition process, a thickness of a deposited material can be controlled by deposition parameters such as the length of time during which the substrate is exposed to the precursor. In an atomic layer deposition step, thickness of a deposited layer can be "self-limiting" based on process conditions such as selected deposition temperature, pressure and time (pulse duration).

By vapor deposition methods of the present invention, a gaseous metal-containing precursor that contains molybdenum or tungsten as the metal, along with a first co-reactant that is a reducing compound, and a second co-reactant that is a nitrogen-containing reducing compound, are introduced to a deposition chamber (a.k.a., "reaction chamber") that contains a substrate. The gaseous metal-containing precursor is a chemical compound that contains a metal atom center chemically associated with halogen atoms and optional oxygen atoms, or chlorine atoms with optional oxygen. The pressures and flow rates of the precursor and co-reactant gas flow, and the deposition chamber conditions (e.g., temperature, pressure, temperature of the substrate, among other conditions), are sufficient to cause the metal atom of the precursor to be released from the other precursor constituents (ligands) within the deposition chamber and for the metal to become deposited onto a surface of the substrate as part of a substantially pure layer of the atomic metal. Volatile by-products of the deposition process can be removed by gas flow through the deposition chamber.

If necessary or desired the gaseous metal-containing precursor can be carried to the deposition chamber using a carrier gas, which may be an inert gas such as helium, argon, nitrogen, neon, xenon, krypton, or a combination thereof. The carrier gas can be combined with the gaseous metal-containing precursor to allow the carrier gas to carry a desired concentration and a desired total amount of the gaseous metal-containing precursor to the deposition chamber and the substrate. The concentration of the gaseous precursor in the carrier gas, and the flow rate of the gaseous carrier gas-precursor mixture to the deposition chamber, can be as desired and as effective to produce a desired deposited metal layer during a particular deposition process, with particular values for these parameters being selected in combination with other parameters of a deposition process such as the size (volume) of the deposition chamber, flow rate of a co-reactant gas, substrate temperature, deposition chamber pressure, among others.

A vapor deposition method can be performed by introducing the gaseous fluids into the deposition chamber using different effective flow options. Each flow of gaseous fluid into the deposition chamber is controlled at a desired rate, pressure, and temperature, and may be provided either in a continuous (steady, uniform) or pulsed (e.g., interrupted) manner. A non-uniform flow is one that is not continuous, i.e., is interrupted periodically in time and duration. The flow is "pulsed," or caused to flow into the deposition chamber during an on-flow period and to not flow into the deposition chamber during an off-flow period. If desired, a purge or vacuum period may also be included during a vapor deposition method.

According to the invention, a reducing gas is used in the vapor deposition method to react with the precursor in the deposition chamber. The reducing gas may be any gaseous reactant that is effective to react with the precursor in a way that releases the atomic metal from the precursor compound in the deposition chamber to allow the atomic metal to be deposited onto the substrate as a continuous film. A useful reducing gas is hydrogen.

Also according to the invention, a nitrogen-containing reducing agent is included in the deposition method to improve the deposition method. The nitrogen-containing reducing compound is a compound that is of a basic nature. For this reason, the presence of the nitrogen-containing reducing compound during a vapor deposition method as described can be effective to drive the reaction of the reducing gas (e.g., hydrogen) and the precursor thermodynamically toward the direction of the reaction-byproducts. A benefit can be a reduced vapor deposition temperature. Useful or preferred vapor deposition processes as described can be performed at a deposition temperature that is comparably lower when compared to a deposition temperature of a similar method that is performed using the same reactants, in the same amounts (pressure, temperature, flow rate), with deposition conditions (pressure, temperature) also being the same, but in the absence of the nitrogen-containing reducing compound.

One or more other benefits may potentially also result when using a nitrogen-containing compound in a vapor deposition method with different substrates (substrate shapes), or substrate materials. Examples of other potential benefits may include one or more of the following: improving the form of the coating such as in terms of coating uniformity with certain substrates (e.g., substrates having-dimensional shape features); and reducing negative chemical effects of the vapor deposition process on the substrate, such as etching or erosion, by assisting in the removal of etch related byproducts.

The nitrogen-containing reducing agent can be any chemical material that can be provided in a desired amount and level of purity to a vapor deposition process, and that will produce a desired effect during the process as described herein. Some non-limiting examples of nitrogen-containing reducing compounds include those characterized by the general formula:

$$H-NR_1R_2$$

wherein the $R_1$ and $R_2$ can be selected to include one of the following combinations:
  each of $R_1$ and $R_2$ is hydrogen (i.e., the compound is $NH_3$),
  $R_1$ is hydrogen and $R_2$ is a lower alkyl (e.g., methyl, ethyl, propyl, butyl, etc.),
  $R_1$ is =$NH_2$ and $R_2$ is hydrogen,
  $R_1$ is a lower alkyl and $R_2$ is a lower alkyl, or
  $R_1$ and $R_2$ connect to form a nitrogen-containing cyclic compound.

These non-limiting and exemplary compounds include $NH_3$; hydrazine ($H_2N=NH_2$); alkyl substituted hydrazines, and alkyl amine and di-alkyl amine compounds such as methyl amine, ethyl amine, butylamine, dimethylamine, diethylamine, etc., and pyridine.

A precursor used in the vapor deposition method as described can be any of various precursors known to be effective for depositing a metal layer of tungsten or molybdenum. The precursor is a compound that contains the metal, which is either tungsten or molybdenum, and one or more associated chemical residues such as fluorine atoms (with optional oxygen), chlorine atoms (with optional oxygen) attached to the metal atom.

One type of precursor is the class of fluorinated precursors. These include the metal (W or Mo), fluorine, and optionally oxygen. These are generally referred to as molybdenum fluorides, molybdenum oxyfluorides, tungsten fluorides, and tungsten oxyfluorides. Specific examples include: molybdenum pentafluoride, molybdenum hexafluoride, tungsten pentachloride, and tungsten hexafluoride.

Other examples are chlorinated and oxy-chlorinated compounds of molybdenum and tungsten. Examples include molybdenum pentachloride, and molybdenum oxychlorides such as $MoCl_5$, $MoOCl_4$, $MoO_2Cl_2$, $WCl_6$, $WCl_5$, $WOCl_4$, and $WO_2Cl_3$. Other halogenated precursors of W and Mo, including brominated and iodinated precursors, will be obvious to those skilled in the art.

The substrate and surface upon which the molybdenum or tungsten is deposited may include any two-dimensional or three-dimensional structure, with particular examples of microelectronic device substrates being a memory device such as a DRAM device or a 3D NAND device, and a "logic" device. Example memory devices can include highly-shaped, high aspect ratio (e.g., at least 40:1, at least 60:1, or greater) surfaces, and surfaces that contain chemically sensitive materials such as titanium nitride. A logic device may be a microelectronic device that includes a microprocessor. Examples include programmable logic devices (PLD) having configurable logic and flip-flops linked together with a programmable interconnect.

The specific chemical composition of a surface of a memory- or logic-type substrate onto which a metal layer as described will be deposited can be any chemical composition that will be useful for the device for providing a layer of deposited molybdenum or tungsten. Generally, the metal layer may be deposited onto a dielectric layer, a ceramic layer, a nucleation layer, or another layer upon which a molybdenum or tungsten metal layer might be usefully deposited. Non-limiting examples of materials of substrate surfaces onto which molybdenum or tungsten may be deposited include: silicon, silicon dioxide, silicon nitride, other silicon-based materials, titanium nitride (TiN), molybdenum (metal), molybdenum carbide (MoC), boron (B), tungsten (W), and tungsten carbon nitride (WCN), AlN, GaN, InN, TaN, ZrN, HfN, NbN, $Mo_2N$, WN, and other metal nitrides. Other oxides such as $Al_2O_3$, $HFO_2$, $ZrO_2$, $TiO_2$, $Nb_2O_5$, $Ta_2O_5$, $Y_2O_3$, $RuO_2$, $IrO_2$, $La_2O_3$ and other oxides from the lanthanide series and combinations thereof.

The presently-described vapor deposition methods can find particular levels of usefulness or advantage when incorporated into methods of depositing tungsten or molybdenum from certain specific types of precursors, and onto certain specific types of substrates. As an example, the use of a nitrogen-containing reducing compound can be used in a vapor deposition method that produces a metal layer deposited from a halogen-containing, e.g., chlorine-containing precursor, onto a substrate that contains titanium nitride. Example reaction schemes for these methods include the following.

For comparison, in a non-inventive method that does not include the nitrogen-containing reducing compound, a reaction that deposits atomic molybdenum onto a substrate as a metal layer can be as follows:

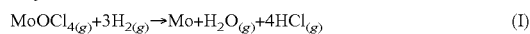
$$MoOCl_{4(g)} + 3H_{2(g)} \rightarrow Mo + H_2O_{(g)} + 4HCl_{(g)} \quad (I)$$

When a nitrogen-containing reducing compound (exemplified as $NH_3$) is added to the reaction, according to the present description, the reaction include the following:

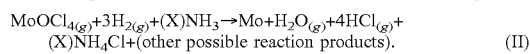
$$MoOCl_{4(g)} + 3H_{2(g)} + (X)NH_3 \rightarrow Mo + H_2O_{(g)} + 4HCl_{(g)} + (X)NH_4Cl + \text{(other possible reaction products)}. \quad (II)$$

Throughout this description, including with respect to these two reaction schemes and all others, a reaction scheme that is presented herein is not intended to represent a complete description of all chemical interactions that occur during a vapor deposition method using the specified precursor and co-reactants. The reaction schemes are provided to illustrate a manner in which reactants or reaction products of each example scheme may be affected by the use of a nitrogen-containing reducing compound, as described.

Referring still to the above two example reaction schemes, the nitrogen-containing reducing compound, especially when present in a vapor deposition method in an amount that is in addition to an otherwise adequate stoichiometric ratio of the hydrogen as a reducing gas, provides an additional (molar) amount of a basic reducing compound present as a reactant; this added amount of the basic reducing compound will push the reaction thermodynamically from the side "reactants" side of the equation to the "reaction products" side of the equation. As a result, the presence of the nitrogen-containing reducing compound has the thermodynamic effect of causing the reaction to proceed at a faster rate as compared to the reaction in the absence of the nitrogen-containing reducing compound, and can also reduce the temperature of the deposition process.

As another advantage, when the reaction is part of a vapor deposition method that deposits the metal layer onto a substrate that includes titanium nitride at its surface (e.g., also having a high aspect ratio feature on the structure), with a precursor and process that may otherwise result in etching of the titanium nitride, the nitrogen-containing reducing gas (e.g., ammonia ($NH_3$)) can be effective to reduce or prevent etching of the titanium nitride. A reaction that produces etching of titanium nitride can be described as follows (using $MoOCl_4$ as an example precursor that causes etching):

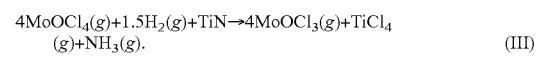
$$4MoOCl_4(g) + 1.5H_2(g) + TiN \rightarrow 4MoOCl_3(g) + TiCl_4(g) + NH_3(g). \quad (III)$$

The ammonia, on the reaction product side, has the thermodynamic effect of inhibiting the reaction and reducing the etching effect of the titanium nitride surface of the substrate. The $NH_3$ can alter the reaction mechanism and coordinate with the HCl by-product, thereby reducing the etching of the TiN layer.

Typically, a method of depositing a metal (e.g., molybdenum or tungsten) layer onto a substrate by vapor deposition of a chlorine-containing precursor (see scheme I, above) is performed at a temperature of at least 480 degrees Celsius, e.g., at a low pressure such as below 100 torr, (e.g., at 60 torr). According to the invention, a method that incorporates the use of a nitrogen-containing basic compound can be performed at a temperature that is reduced relative to the temperature required without the nitrogen-containing basic compound (with other reactants and conditions being the same). Example methods may be effectively performed at a temperature that is below 480 degrees Celsius, e.g., below 450 or 400 degrees Celsius.

Deposition of atomic molybdenum or atomic tungsten using a gaseous metal-containing precursor (including molybdenum or tungsten and one or more carbon-containing ligands) as described can be performed using available vapor deposition equipment and generally understood techniques adapted for use to deposit a layer of atomic molybdenum or atomic tungsten from a halogenated precursor and reducing gas, as described herein, additionally with the introduction of a nitrogen-containing reducing gas (which is also a base) into the deposition chamber.

As an example of a useful system for a method of the present description, FIG. 1 schematically (and not to scale)

shows a system that can be useful for carrying out a vapor deposition process as described, which may be chemical vapor deposition, atomic layer deposition, or a modified version or a derivative of either of these. FIG. 1 shows vapor deposition system 2, including deposition chamber 10 having interior 12 which contains platen 14, which supports substrate 16. Interior 12 as illustrated is sized to accommodate only a single substrate 16, but may instead be of any size desired for containing multiple substrates for vapor deposition processing.

Still referring to FIG. 1, cylinders 40, 42, 44, and 46 are connected to interior 12 to allow for gaseous fluid to selectively flow from each cylinder into interior 12. Each of the cylinders can contain a liquid or gaseous raw material to be supplied to interior 12 in gaseous form for use in a vapor deposition step. For example, cylinder 46 can contain a gaseous metal-containing precursor as described. Cylinder 44 can contain inert gas for use as a carrier gas to carry a concentration of the metal-containing precursor to interior 12. In use, carrier gas from carrier gas-containing cylinder 44 can flow through the conduit that can also be connected through open valves to cylinder 46, which contains the precursor. The combination of the carrier gas and precursor can be controlled to flow into interior 12.

Cylinder 42 may can contain a (first) co-reactant such as a reducing gas, e.g., hydrogen gas. One or more additional optional cylinders (not shown) may also be present to contain and supply any of other various useful or co-reactants or other gaseous fluid such as another inert gas (e.g., for a purge step) to interior 12.

Cylinder 40 contains a nitrogen-containing reducing gas as described herein.

Though not specifically shown, any of a variety of known measurement or flow control devices can also be present in system 2 to monitor and adjust the amounts and relative amounts of flow of each gaseous fluid from the cylinders, as well as conditions such as temperature or pressure of a gaseous flow, a temperature of interior 12, or a temperature of platen 14 or substrate 16; these may include pressure regulators, flow regulators (e.g., mass flow regulators), sensors (pressure sensors, temperature sensors), and the like. Control system 50 (which may be or may include a computer, central processing unit (CPU), programmable logic controller (PLC), or the like, includes wiring 52 or other (e.g., wireless) communication devices to electronically connect control system 50 to select valves, sensors, or other flow control devices of vapor deposition system 2. Control system 50, by controlling the valves and optionally other flow control mechanisms, and by monitoring pressure and temperature sensors, is effective to control a flow of each of the gaseous fluids of the cylinders to provide a desired combination of flows of gaseous fluids from the cylinders into interior 12.

A method as described can be performed in a deposition chamber that contains (e.g., comprises, consists of, or consists essentially of) as an atmosphere, during use, substantially only the gaseous precursor, optional carrier gas, co-reactant gas (e.g., a reducing gas such as hydrogen), the nitrogen-containing reducing gas, and optional inert purge gas. For purposes of the present disclosure, a deposition chamber or related gas flow or combination of gas flows that consists essentially of a specified combination of gaseous materials is considered to contain the specified combination of gaseous materials and not more than an insubstantial amount of any other gaseous material, e.g., not more than 2, 1, 0.5, 0.1, 0.05, 0.01, or 0.005 percent (by mass) of any other gaseous material.

The amount of gaseous precursor (a.k.a., precursor vapor), the amount of co-reactant gas (e.g., reducing gas such as hydrogen), the amount of optional purge gas, and the amount of nitrogen-containing reducing compound, that is each supplied to a deposition chamber, can be an amount of each that will be useful to produce a desired effect of each gaseous fluid, to produce as a result of the method a metal layer of molybdenum or tungsten. The amounts of the respective gases supplied to a deposition chamber, in terms of their respective flowrates, can be based on factors that include other processing parameters, the desired amount (e.g., thickness) of a deposited metal layer, the desired deposition rate, the size (volume) of the deposition chamber, and the interior pressure of the deposition chamber. Also, the example amounts and ranges of each gaseous fluid described as being useful to supply to a deposition chamber can be consistent relative to one another, but larger or smaller based on a similar mathematical factor that is determined by the size of a deposition chamber used.

The amount (flow) of each reducing gas should be included in the deposition chamber to provide an amount that is in a range from 1 to 10,000 moles of each reducing gas per reacting component of the metal precursor. A "reacting component" is a halogen group or oxy-halogen group of a halogenated or oxy-halogenated precursor. Accordingly, for a precursor that is $MoCl_5$ containing 5 reacting components, a deposition method may include a flow of from 2.5 to 25,000 sccm (standard cubic centimeter per minute) of hydrogen ($H_2$), along with a flow of from 2.5 to 25,000 sccm nitrogen-containing reducing gas (e.g., $NH_3$), per 1 sccm precursor.

An internal pressure of the deposition chamber can be one that is effective for deposition of a metal layer as described. Typically, a deposition chamber used for chemical vapor deposition operates at a pressure that is not greater than approximately ambient pressure, typically understood to be approximately 760 Torr. Often, a deposition chamber will operate with a pressure that is substantially below atmospheric pressure, such as at an interior pressure that is in a range from 0.1 to 300 Torr, e.g., in a range from 1, 5, or 10 Torr to 40, 60, or 100 Torr.

A substrate, during deposition, can be held at any temperature that is effective for depositing molybdenum or tungsten onto the substrate according to the present description. A useful temperature can be one that will effectively allow for deposition of a metal layer as described, from any one of the described precursors. A useful temperature will depend on the type of substrate used and the temperature. Useful or preferred deposition temperatures (e.g., substrate temperatures) may be below 480, 450, or 400 degrees Celsius (e.g., at a pressure of below 100 torr, e.g., at about 60 torr).

Methods as described can be performed by deposition steps that include processing parameters, including those described herein, alone or in combination, that will result in one or desirably a combination of various desired physical properties of a processed substrate. Desired physical properties include one or more of a desired level of uniformity of a metal layer over a horizontal surface or surfaces of the substrate, or to produce an interconnect, a contact, an electrode, or the like; a desired level of uniformity, conformality, step coverage, or a combination of these for a metal layer deposited onto a three-dimensional substrate; a desired composition of the deposited metal layer, such as a low level of impurities (e.g., carbon or other non-metal materials); a low electrical resistivity of the deposited metal layer; or a combination of these.

A metal layer deposited onto a substrate according to a method as described can have a desirably high concentration of elemental metal, which is either molybdenum or tungsten, e.g., at least 99.5, 99.9, or 99.99 atomic purity percent molybdenum or tungsten, or greater. An amount of non-metal materials, i.e., total impurities in a layer of deposited metal, can preferably be below 0.5, 0.1, or 0.01 atomic percent of total non-metal impurities based on the total amount of the metal layer. The amount of carbon present as an impurity can be measured using known analytical techniques such as x-ray fluorescence methods (XRF).

A desired layer of deposited molybdenum or tungsten can have a low resistivity, such as a resistivity as low as 10 $\mu\Omega$-cm, or as low as 30 $\mu\Omega$cm, for a molybdenum or tungsten film having a thickness of 5 nanometers.

A layer of deposited molybdenum or tungsten can be of any desired thickness, e.g., of a thickness in a range from 10 to 5000 angstroms, or from 30 to 500 angstroms.

The invention claimed is:

1. A method of depositing metal onto a substrate from a metal-containing precursor, the method comprising:
    vaporizing the metal-containing precursor comprising $MoCl_5$, $MoOCl_4$, $MoO_2Cl_2$, $WCl_6$, $WCl_5$, $WOCl_4$, or $WO_2Cl_3$,
    flowing the vaporized precursor to a deposition chamber containing the substrate, and
    flowing reducing co reactant gas comprising hydrogen gas to the deposition chamber while flowing gaseous nitrogen-containing reducing compound to the deposition chamber, the nitrogen-containing reducing compound has a formula H—$NR_1R_2$ wherein:
    $R_1$ is hydrogen and $R_2$ is a lower alkyl,
    $R_1$ is a lower alkyl and $R_2$ is a lower alkyl, or
    $R_1$ and $R_2$ connect to form a nitrogen-containing cyclic compound,
to deposit metal of the precursor on the substrate, wherein the deposited metal has a resistivity of 10 $\mu\Omega$-cm to 30 $\mu\Omega$-cm at a thickness of 5 nanometers, wherein a surface of the substrate consists of titanium nitride, wherein the deposition temperature is below 480 degrees Celsius, and wherein the nitrogen-containing reducing compound reduces etching of the titanium nitride surface by reacting with a hydrogen chloride to neutralize and volatilize a hydrogen chloride reaction product.

2. The method of claim 1, wherein the metal is tungsten.

3. The method of claim 1, wherein the metal is molybdenum.

4. The method of claim 1, wherein $R_2$ is a lower alkyl.

5. The method of claim 1, wherein $R_1$ and $R_2$ connect to form a nitrogen-containing cyclic compound.

6. The method of claim 1, wherein the deposited metal has a resistivity of 10 $\mu\Omega$-cm at a thickness of 5 nanometers.

7. A method of depositing metal onto a substrate from a metal-containing precursor, the method comprising:
    vaporizing the metal-containing precursor, wherein the metal is molybdenum and wherein the metal-containing precursor is selected from $MoCl_5$, $MoOCl_4$, and $MoO_2Cl_2$,
    flowing the vaporized precursor to a deposition chamber containing the substrate, and
    flowing reducing co reactant gas comprising hydrogen gas to the deposition chamber while flowing gaseous nitrogen-containing reducing compound to the deposition chamber, the nitrogen-containing reducing compound has a formula H—$NR_1R_2$ wherein;
    $R_1$ is hydrogen and $R_2$ is a lower alkyl,
    $R_1$ is =$NH_2$ and $R_2$ is hydrogen,
    $R_1$ is a lower alkyl and $R_2$ is a lower alkyl, or
    $R_1$ and $R_2$ connect to form a nitrogen-containing cyclic compound,
to deposit molybdenum metal of the precursor on the substrate, wherein the deposited molybdenum metal has a resistivity of 10 $\mu\Omega$-cm to 30 $\mu\Omega$-cm at a thickness of 5 nanometers, wherein a substrate surface consists of titanium nitride, wherein the deposition temperature is below 480 degrees Celsius, and wherein the nitrogen-containing reducing compound reduces etching of the titanium nitride surface by reacting with a hydrogen chloride to neutralize and volatilize a hydrogen chloride reaction product.

8. The method of claim 7 wherein during the deposition of the molybdenum metal a nitrogen-containing portion of the nitrogen-containing reducing compound associates with the chlorine of the precursor.

9. The method of claim 7, wherein the deposited metal has a resistivity of 10 $\mu\Omega$-cm at a thickness of 5 nanometers.

10. The method of claim 7 wherein the method comprises flowing the hydrogen to the deposition chamber in an amount in a range from 2.5 to 25,000 sccm of hydrogen ($H_2$), along with a flow of from 2.5 to 25,000 sccm nitrogen-containing reducing gas, per 1 sccm of precursor.

11. The method of claim 7 wherein the substrate comprises three-dimensional surfaces.

12. The method of claim 7 wherein the substrate comprises surfaces having an aspect ratio of at least 20:1.

13. The method of claim 7, wherein $R_2$ is a lower alkyl.

14. The method of claim 7, wherein $R_1$ and $R_2$ connect to form a nitrogen-containing cyclic compound.

15. The method of claim 7, wherein the nitrogen-containing reducing compound is pyridine.

16. The method of claim 7, wherein the nitrogen-containing reducing compound is a dialkylamine.

* * * * *